(12) United States Patent
Chee et al.

(10) Patent No.: US 8,178,962 B1
(45) Date of Patent: May 15, 2012

(54) SEMICONDUCTOR DEVICE PACKAGE AND METHODS OF MANUFACTURING THE SAME

(75) Inventors: Soon-Shin Chee, Sunnyvale, CA (US); Paul Y. Wu, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/073,367

(22) Filed: Mar. 28, 2011

Related U.S. Application Data

(62) Division of application No. 12/427,362, filed on Apr. 21, 2009, now abandoned.

(51) Int. Cl.
*H01L 23/02* (2006.01)

(52) U.S. Cl. ............... 257/690; 257/778; 257/E23.01; 257/E23.079; 257/E23.141

(58) Field of Classification Search .............. 257/690, 257/778, E23.01, E23.079, E23.141
See application file for complete search history.

(56) References Cited

U.S. PATENT DOCUMENTS 7,388,439 B2 6/2008 Smolders et al.
2004/0127011 A1 7/2004 Huang et al.
2006/0186517 A1* 8/2006 Jang .............................. 257/676

OTHER PUBLICATIONS

U.S. Appl. No. 12/427,362, filed Apr. 21, 2009, Chee et al.
Tummala, Rao, *Fundamentals of Microsystems Packaging*, May 8, 2001, 1st Edition, pp. 114-115, McGraw-Hill Professional, New York, New York, USA.

* cited by examiner

*Primary Examiner* — Cuong Q Nguyen
*Assistant Examiner* — Tran Tran
(74) *Attorney, Agent, or Firm* — Robert M. Brush; LeRoy D. Maunu; Lois D. Cartier

(57) ABSTRACT

A semiconductor device package and methods of manufacturing the same are described. In some examples, a semiconductor device includes an IC die including a ring of die pads around a periphery thereof, lands disposed within the ring of die pads, bond terminals coupled to the lands, the bond terminals being wire-bonded to respective ones of the die pads, and at least one capacitor having respective terminals mounted to respective ones of the lands.

11 Claims, 6 Drawing Sheets

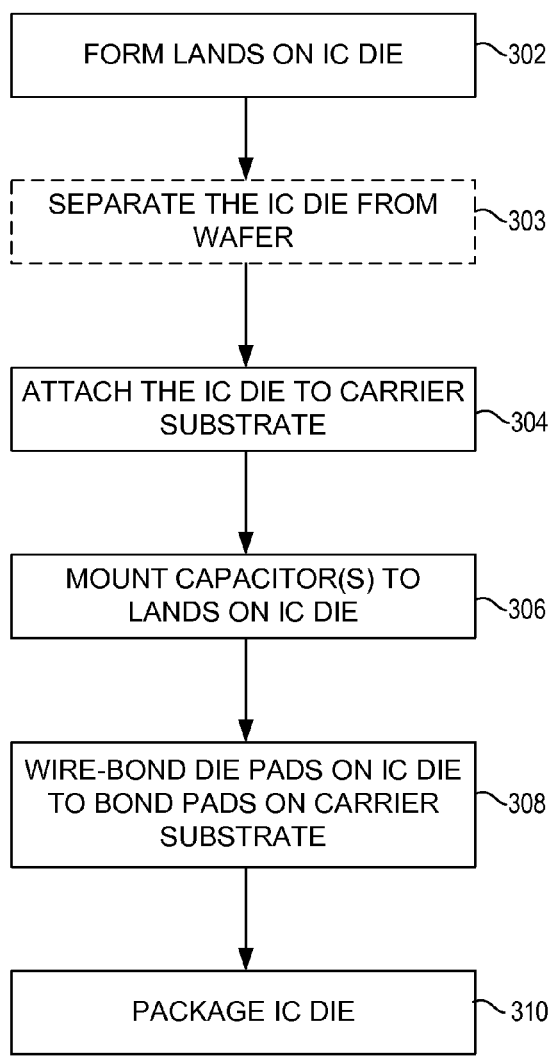
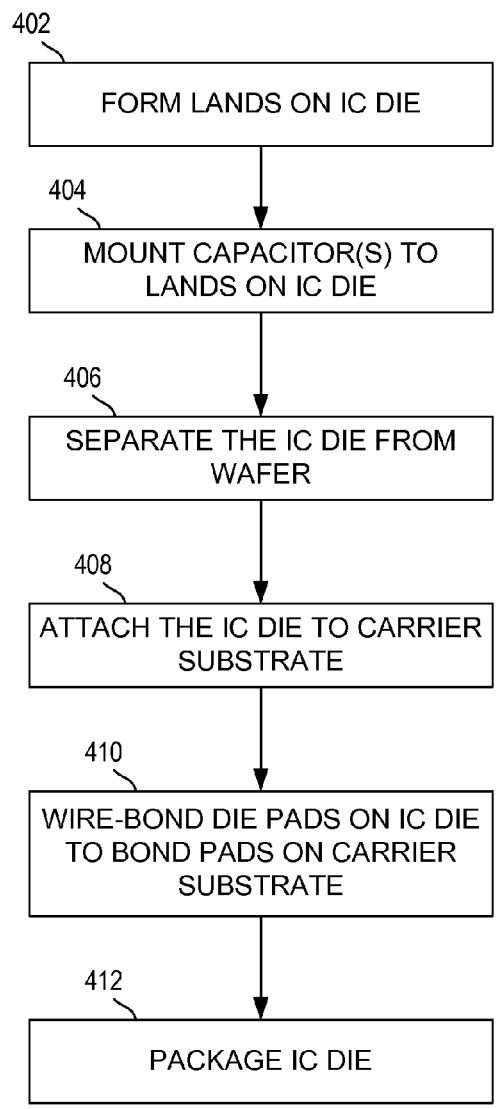
FIG. 3
FIG. 4

SEMICONDUCTOR DEVICE PACKAGE AND METHODS OF MANUFACTURING THE SAME

FIELD OF THE INVENTION

One or more aspects of the present invention relate generally to semiconductor devices and, more particularly, to a semiconductor device package and methods of manufacturing the same.

BACKGROUND

As integrated circuits (ICs) have become more complex, more pins are employed in a limited area, and more I/O signal pins are switching at high speed at the same time. Thus, decoupling the power supplies through efficient usage of low inductance capacitors has become increasingly essential. In wire-bonded IC packages, it becomes difficult to locate the capacitors. In a wire-bonded package, an IC die is attached to a carrier and die pads on the IC die are electrically connected to bond pads on the carrier using wires ("wire-bonds"). In some wire-bonded packages, capacitors are located on the carrier. However, the distance between the die and such capacitors may result in high loop inductance (much higher than capacitors on the carrier in a flip-chip package, for example). High loop inductance deleteriously affects the decoupling function of the capacitors. Another solution is to form the capacitors on the IC die itself. However, the formation of capacitors on the IC die can be impossible or impractical, can use often scarce real estate on the IC die, can increase the size of the IC die, and can increase the cost of the IC die.

Accordingly, there exists a need in the art for a semiconductor device package with capacitors that overcomes the aforementioned disadvantages.

SUMMARY

An aspect of the invention relates to methods of manufacturing at least one semiconductor device. In some embodiments, a method includes: forming lands on an integrated circuit (IC) die, the IC die including a ring of die pads around a periphery thereof, the lands being disposed within the ring of die pads, each of the lands being electrically coupled to at least one of the die pads; mounting respective terminals of at least one capacitor to respective ones of the lands; wire-bonding the die pads of the IC die to respective bond pads on a carrier substrate; and packaging the IC die.

In some embodiments, the mounting includes soldering the respective terminals of the at least one capacitor to the respective ones of the lands. In some embodiments, the mounting includes attaching the at least one capacitor to the IC die, wherein the respective terminals thereof contact the respective ones of the lands.

The IC die can be one of a plurality of IC dice formed on a wafer and wherein, prior to the wire-bonding, the method further includes separating the IC die from the wafer, and attaching the IC die to the carrier substrate.

Another aspect of the invention relates to a method of manufacturing at least one semiconductor device. In some embodiments, the method includes: forming a capacitor carrier including a site having lands and bond terminals coupled to the lands; mounting respective terminals of at least one capacitor to respective ones of the lands; attaching the site of the capacitor carrier to an integrated circuit (IC) die, the IC die including a ring of die pads around a periphery thereof and being attached to a carrier substrate, the site of the capacitor carrier being within the ring of die pads of the IC die; and wire-bonding the bond terminals of the site to respective ones of the die pads of the IC die.

In some embodiments, the method includes wire-bonding the die pads of the IC die to respective bond pads on the carrier substrate, and packaging the IC die. The IC die can be one of a plurality of IC dice attached to the carrier substrate and the site can be one of a plurality of sites of the capacitor carrier respectively attached to the plurality of IC dice.

In some embodiments, the mounting includes soldering the respective terminals of the at least one capacitor to the respective ones of the lands. In some embodiments, the mounting includes attaching the at least one capacitor to the capacitor carrier, wherein the respective terminals thereof contact the respective ones of the lands.

Another aspect of the invention relates to a semiconductor device. In some embodiments, the device includes: a carrier substrate having bond pads; an IC die including a ring of die pads around a periphery thereof, the die pads being wire-bonded to respective ones of the bond pads on the carrier substrate; lands disposed within the ring of die pads, each of the lands being electrically coupled to at least one of the die pads; and at least one capacitor having respective terminals mounted to respective ones of the lands.

In some embodiments, the lands are part of a redistributive metal layer formed on the IC die. In some embodiments, the semiconductor device further includes a molded package encapsulating the IC die and the at least one capacitor.

In some embodiments, the semiconductor device further includes a capacitor carrier and bond terminals. The capacitor carrier is attached to the IC die and includes the lands and the at least one capacitor. The bond terminals are coupled to the lands, and are wire-bonded to respective ones of the die pads. The capacitor carrier can include, for example, an organic or ceramic material. The semiconductor device can further include a molded package encapsulating the IC die, the capacitor carrier, and the at least one capacitor.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

FIG. 3 is a flow diagram depicting a method of manufacturing the semiconductor device of FIG. 1 according to some embodiments of the invention;

FIG. 4 is a flow diagram depicting another method of manufacturing the semiconductor device of FIG. 1 according to some embodiments of the invention;

DETAILED DESCRIPTION

Figure 1:
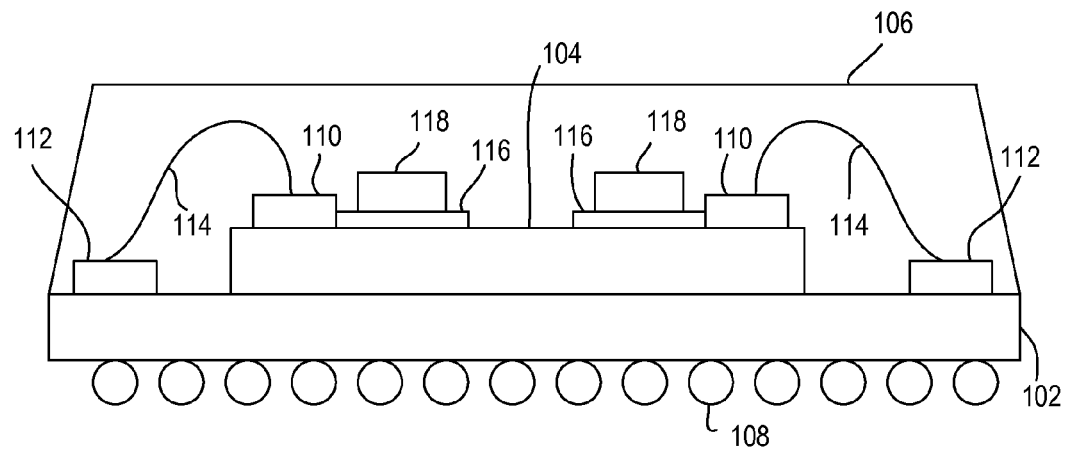
FIG. 1 is a cross-section of a semiconductor device according to some embodiments of the invention.

FIG. 1 is a cross-section of a semiconductor device 100 according to some embodiments of the invention. The semiconductor device 100 includes a carrier substrate 102, an integrated circuit (IC) die 104, and a cap 106. The cap 106 provides a package for the IC die 104. The IC die 104 may be any type of IC known in the art. The carrier substrate 102 includes an array of solder balls 108 (e.g., in a ball grid array (BGA) package) that can be electrically and mechanically coupled to a circuit board or like type substrate (not shown). It is to be understood that the solder balls 108 are merely exemplary and that the carrier substrate 102 may include other types of contacts, such as lands (e.g., in a land grid array (LGA) package), pins (e.g., in a quad flat package (QFP)), or the like. The cap 106 may be any type of molded encapsulation material, such as plastic (e.g., in a plastic BGA package). Although a carrier substrate 102 is shown by example, it is to be understood that the semiconductor device may include a carrier in place of the carrier substrate, such as a lead frame or the like.

The IC die 104 is mechanically mounted to the carrier substrate 102 (e.g., by epoxy or the like type adhesive). The IC die 104 includes a plurality of die pads 110. The die pads 110 can be arranged around the periphery of the IC die 104 (e.g., shown below in FIG. 2). The die pads 110 can be any type of metal, such as copper, aluminum, gold, and the like. The die pads 110 are electrically coupled to active circuitry (not shown) integrated on the IC die 104. The die pads 110 are also electrically coupled to bond pads 112 formed on the carrier substrate 102 by wires 114. The bond pads 112 and the wires 114 may be any type of metal, such as copper, aluminum, gold, or the like. The electrical connection between the IC die 104 and the carrier substrate 102 is referred to as "wire-bonding".

The IC die 104 further includes lands 116 surrounded by the die pads 110. The lands 116 may be any type of metal, such as copper, aluminum, gold, or the like. Each of the lands 116 may be coupled to one or more of the die pads 110. Pairs of the lands 116 are coupled to terminals of capacitors 118. The capacitors 118 may be any type of capacitors, such as surface-mount chip-capacitors or the like. The capacitors 118 may be used to provide various functions to the IC die 104, such as de-coupling capacitance. In some cases, the carrier substrate 102 may have insufficient space for capacitors. Even if the carrier substrate 102 had space for capacitors, such capacitors would be farther away from the IC die 104 than the capacitors 118 formed on the IC die 104, resulting in a higher loop inductance than the capacitors 118 formed on the IC die 104. Accordingly, the capacitors 118 mounted on the IC die 104 advantageously provide for reduced loop inductance, since the capacitors 118 are mounted nearer to the die pads 110 than capacitors on the carrier substrate 102 would be.

Figure 2:
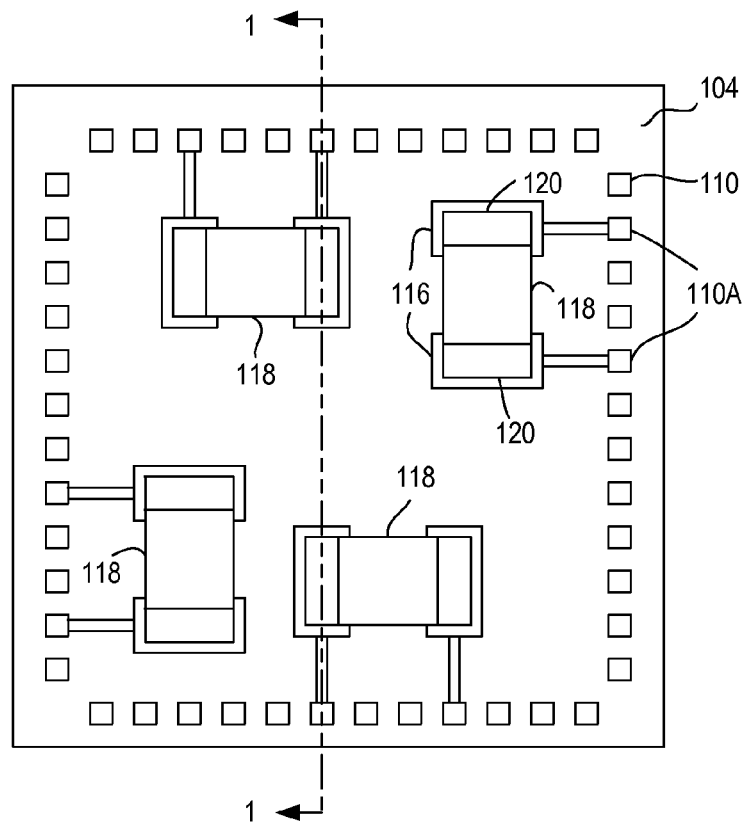
FIG. 2 is a top view of the IC die of FIG. 1 according to some embodiments of the invention.

FIG. 2 is a top view of the IC die 104 according to some embodiments of the invention. The cross-section of FIG. 1 is taken along the line 1-1 shown in FIG. 2. The carrier substrate 102 and cap 106 are omitted from FIG. 2, for clarity. The die pads 110 are formed in a ring around the periphery of the IC die 104. Some of the die pads 110A of the die pads 110 are coupled to some of the lands 116. Each of the capacitors 118 (e.g., four are shown) are electrically and mechanically coupled to a pair of the lands 116. For example, a pair of terminals 120 of each of the capacitors 118 may be soldered to a respective pair of the lands 116. Alternatively, each of the capacitors may be attached to the IC die 104 via an epoxy or other type of adhesive such that the pair of terminals 120 are in contact with a respective pair of the lands 116. In this manner, each of the capacitors 118 provides capacitance across a respective pair of the die pads 110A (e.g., for purposes of providing de-coupling capacitance). In the present example, each of the lands 116 is shown as being coupled to a respective one of the die pads 110A. Those skilled in the art will appreciate that one or more of the lands 116 may be coupled to more than one of the die pads 110.

FIG. 3 is a flow diagram depicting a method 300 of manufacturing the semiconductor device 100 according to some embodiments of the invention. The method 300 is first described generally with respect to a single, separate IC die 104. It is to be understood that, during some steps, the IC die 104 may be part of a wafer having a plurality of IC dice thereon (i.e., not yet separated). In such case, the respective steps of the method 300 may be performed across all IC die on such a wafer. Aspects of the method 300 may be understood with reference to FIGS. 1 and 2 described above.

The method 300 begins at step 302, where lands 116 are formed on the IC die 104. The lands 116 may be formed by patterning a redistribution layer (RDL) on the IC die 104. Such an RDL can be patterned using a standard photolithographic process. In other embodiments, the RDL can be formed using an organic process. For example, the RDL can be formed by depositing an organic material on the IC die 104 (e.g., polyimide, Benzocyclobutene (BCB), or the like), forming via openings in the organic material, forming metal over the organic material, and etching the metal to produce the desired pattern of lands 116.

At step 304, the IC die 104 is attached to the carrier substrate 102. At step 306, one or more capacitors 118 is/are mounted to the lands 116 on the IC die 104. In particular, for each capacitor 118, respective terminals 120 thereof are in contact with respective ones of the lands 116. In some embodiments, the capacitor(s) 118 is/are soldered to the lands 116. In other embodiments, the capacitor(s) 118 is/are attached to the IC die 104 such that the respective terminals thereof are in contact with respective ones of the lands 116. At step 308, the die pads 110 on the IC die 104 are wire-bonded to respective bond pads 112 on the carrier substrate 102. At step 310, the IC die 104 is packaged. For example, the cap 106 is molded to encapsulate the IC die 104.

Figure 8:
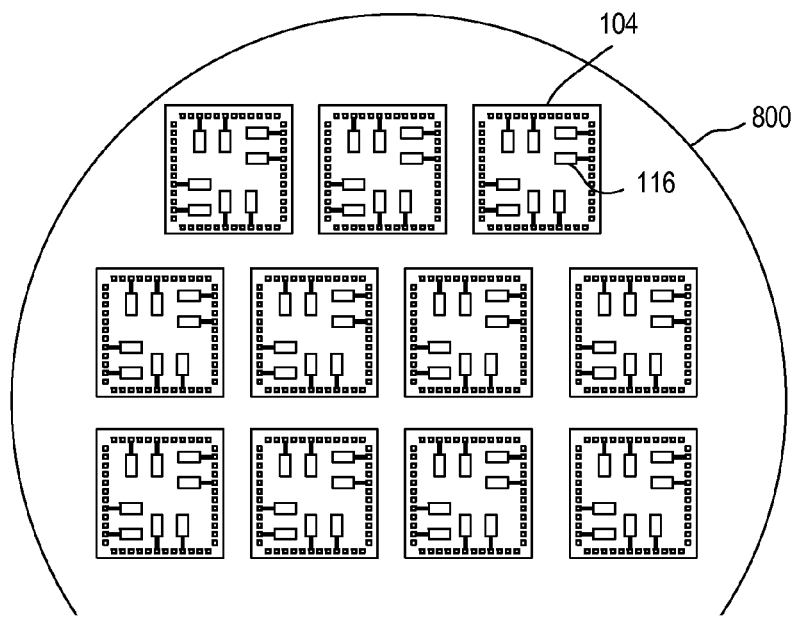
FIG. 8 depicts a wafer having a plurality of the IC dice formed thereon.

As noted above, in some embodiments, the IC die referenced in the method 300 is part of a plurality of IC dice on a wafer. For example, FIG. 8 depicts a wafer 800 having a plurality of the IC dice 104 formed thereon. In such case, the lands 116 may be formed on each IC die 104 while the IC die 104 is on the wafer (step 302). The IC die 104 may be separated from the wafer 800 after wafer thinning (if required), e.g., by wafer sawing. Each IC die 104 is then processed as in steps 304-310. The IC die 104 are separated from the wafer at step 303 performed between steps 302 (formation of lands) and 304 (attachment to the carrier substrate).

Figure 9:
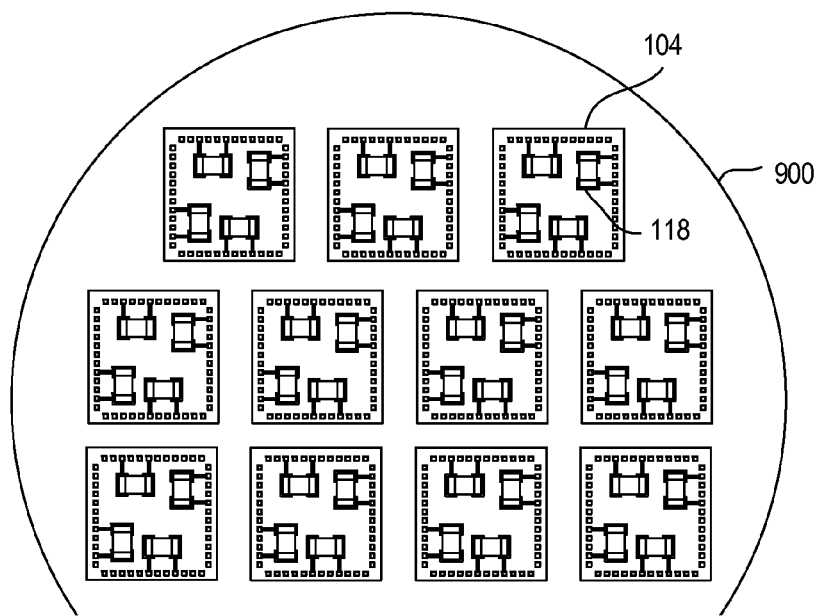
FIG. 9 depicts another wafer having a plurality of the IC dice formed thereon.

FIG. 4 is a flow diagram depicting another method 400 of manufacturing the semiconductor device 100 according to some embodiments of the invention. In the present embodiment, the IC die referenced in the method 400 is part of a plurality of IC dice on a wafer. For example, FIG. 9 depicts a wafer 900 having a plurality of the IC dice 104 formed thereon. The principle difference between the method 400 and the method 300 is that, in the method 400, the capacitors are mounted to the IC die while on the wafer. In the method 300, the capacitors are mounted on the IC die after separation from the wafer.

The method 400 begins at step 402, where lands 116 are formed on the IC die 104. The lands 116 may be formed by patterning a redistribution layer (RDL) on the IC die 104. Such an RDL can be patterned using a standard photolithographic process. In other embodiments, the RDL can be formed using an organic process. For example, the RDL can be formed by depositing an organic material on the IC die 104 (e.g., polyimide, BCB, or the like), forming via openings in the organic material, forming metal over the organic material, and etching the metal to produce the desired pattern of lands 116.

At step 404, one or more capacitors 118 is/are mounted to the lands 116 on the IC die 104. At step 406, the IC die 104 is separated from the wafer 900. At step 408, the IC die 104 is attached to the carrier substrate 102. At step 410, the die pads 110 on the IC die 104 are wire-bonded to respective bond pads 112 on the carrier substrate 102. At step 412, the IC die 104 is packaged. For example, the cap 106 is molded to encapsulate the IC die 104. As shown in FIG. 9, the capacitor(s) can be mounted at step 404 across all IC die 104 on the wafer 900. After separation at step 406, each IC die 104 can be processed as in steps 408-412.

Figure 5:
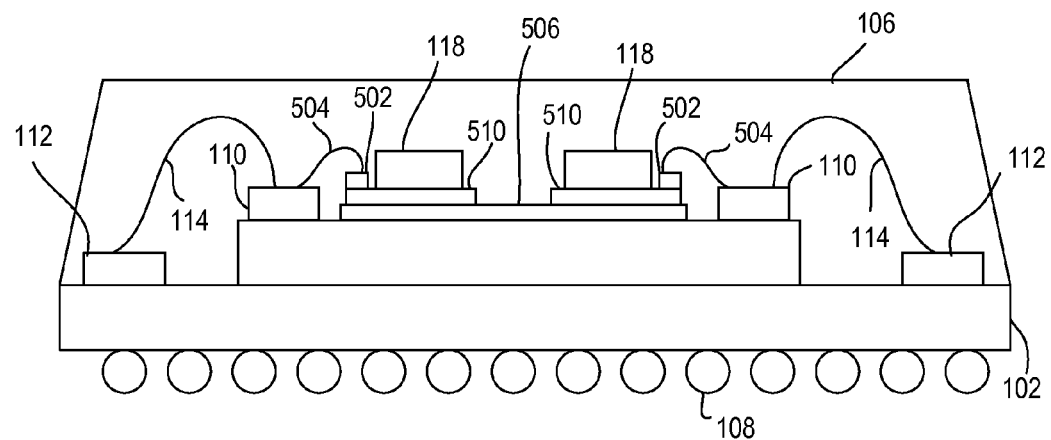
FIG. 5 is a cross-section of a semiconductor device according to some embodiments of the invention.
Figure 10:
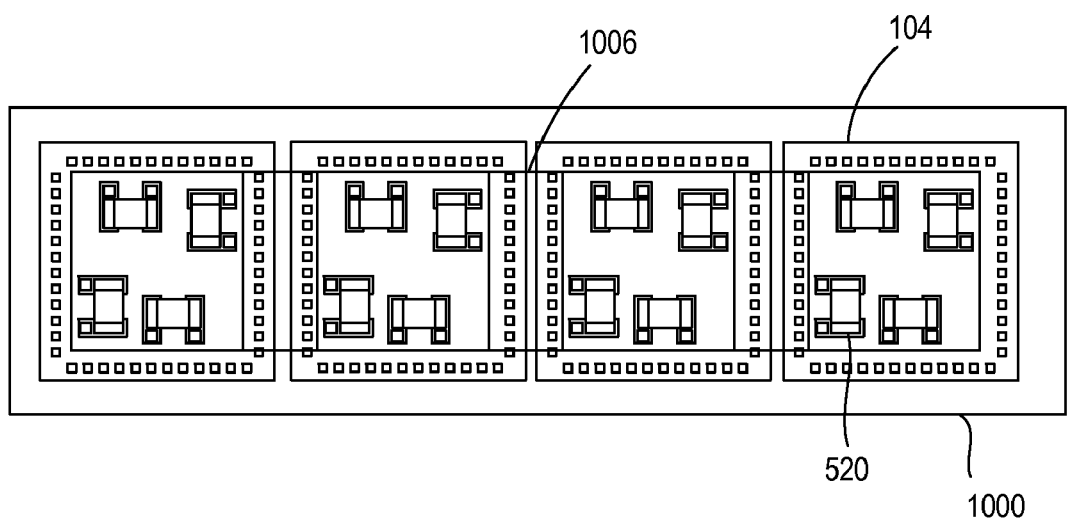
FIG. 10 depicts a carrier substrate having a plurality of the IC dice attached thereto.

FIG. 5 is a cross-section of a semiconductor device 500 according to some embodiments of the invention. Elements of FIG. 5 that are the same or similar to those of FIGS. 1 and 2 are designated with identical reference numerals and are described in detail above. In the present embodiment, the capacitor lands are not formed directly on the IC die 104. Rather, a capacitor carrier 506 is attached to the IC die 104. The capacitor carrier 506 may be attached using epoxy or a like type adhesive. The capacitor carrier 506 may be an organic or ceramic substrate. The capacitor carrier 506 includes a site having lands 510. A "site" on capacitor carrier 506 includes a length and width such that the lands 510 are within the ring of die pads 110 on the IC die 104. Capacitor carrier 506 can include one or more sites, and each ring of die pads 110 on the IC die 104 can correspond to one or more sites on capacitor carrier 506. For example, FIG. 10 shows a capacitor carrier 1006 having 16 sites 520, with four sites being located within the ring of die pads 110 of each IC die 104. The lands 510 may be any type of metal, such as copper, aluminum, gold, or the like. Each of the lands 510 includes at least one bond terminal 502. Each of the bond terminals 502 is coupled to at least one of the die pads 110 by wires 504. The wires 504 may be any type of metal, such as copper, aluminum, gold, or the like. Pairs of the lands 510 are coupled to terminals of capacitors 118. The capacitors 118 may be any type of capacitors, such as surface-mount chip-capacitors or the like. The capacitors 118 may be used to provide various functions to the IC die 104, such as de-coupling capacitance.

Figure 6:
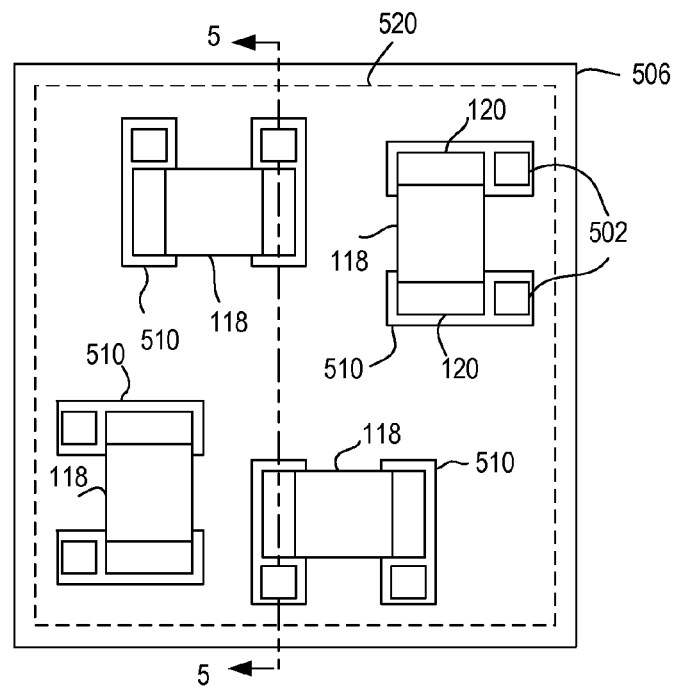
FIG. 6 is a top view of a capacitor carrier according to some embodiments of the invention.

FIG. 6 is a top view of the capacitor carrier 506 according to some embodiments of the invention. The cross-section of FIG. 5 is taken along the line 5-5 shown in FIG. 6. The carrier substrate 102, the IC die 104, and cap 106 are omitted from FIG. 6 for clarity. Each of the capacitors 118 (e.g., four are shown) are electrically and mechanically coupled to a pair of the lands 510 in each site 520. For example, a pair of terminals 120 of each of the capacitors 118 may be soldered to a respective pair of the lands 510. Alternatively, each of the capacitors may be attached to the capacitor carrier 506 via an epoxy or other type of adhesive such that the pair of terminals 120 are in contact with a respective pair of the lands 510. In the present example, each of the lands 510 is shown as having a single bond terminal 502. Those skilled in the art will appreciate that one or more of the lands 510 may include a plurality of bond terminals 502 for wire-bonding to a respective plurality of die pads 110 on the IC die 104.

Figure 7:
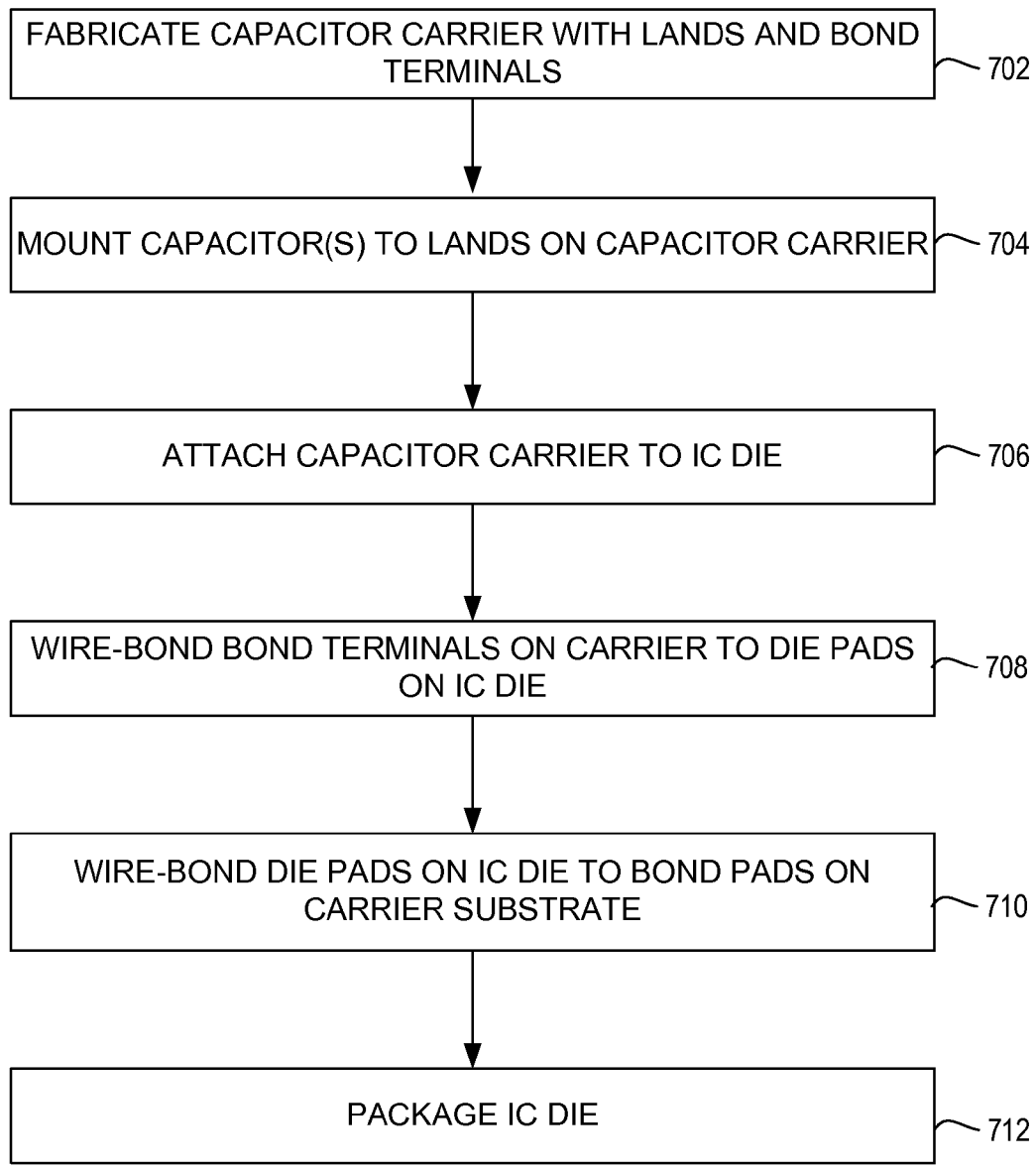
FIG. 7 is a flow diagram depicting a method of manufacturing the semiconductor device of FIG. 5 according to some embodiments of the invention.

FIG. 7 is a flow diagram depicting a method 700 of manufacturing the semiconductor device 500 according to some embodiments of the invention. Aspects of the method 700 may be understood with reference to FIGS. 5 and 6 described above. The method 700 is described generally with respect to the capacitor carrier 506 having a single site 520, as described above. It is to be understood that the capacitor carrier 506 may include a plurality of sites 520 for a plurality of IC dice 104. In such case, some steps of the method 700 may be performed across all sites 520 of the capacitor carrier 506. The method 700 is first described with respect to a single site 520 on the capacitor carrier 506.

The method 700 begins at step 702, where a capacitor carrier 506 is fabricated including a site having lands 510 and bond terminals for an IC die 104. At step 704, at least one capacitor 118 is mounted to the lands 510. In particular, for each capacitor 118, respective terminals 120 thereof are in contact with respective ones of the lands 510. In some embodiments, the capacitor(s) 118 is/are soldered to the lands 510. In other embodiments, the capacitor(s) 118 is/are attached to the capacitor carrier 506 such that the respective terminals thereof are in contact with respective ones of the lands 510.

At step 706, the capacitor carrier 506 is attached to the IC die 104. In particular, the site 520 of the capacitor carrier 506 is disposed within the ring of die pads 110. At step 708, bond terminals 502 on the capacitor carrier 506 are wire-bonded to respective ones of the die pads on the IC die 104. At step 710, the die pads 110 on the IC die 104 are wire-bonded to respective bond pads 112 on the carrier substrate 102. At step 712, the IC die 104 is packaged. For example, the cap 106 is molded to encapsulate the capacitor carrier 506 and the IC die 104.

In some embodiments, a carrier substrate supports a plurality of the IC dice 104. For example, FIG. 10 depicts a carrier substrate 1000 having a plurality of the IC dice 104 attached thereto (e.g., four are shown in a strip). The bond pads 112 on the carrier substrate 1000 have been omitted, for clarity. The capacitor carrier 1006 is formed to include a plurality of the sites 520 corresponding to the plurality of the IC dice 104 (steps 702 and 704). The capacitor carrier 1006 can be attached such that the plurality of the sites 520 are respectively aligned with the plurality of the IC dice 104 (step 706). The unused portions of the capacitor carrier 1006 can be removed and the remaining steps of the method 700 performed (steps 708-712) across all of the plurality of IC dice 104.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A semiconductor device, comprising:
    an IC die including a ring of die pads around a periphery thereof;
    lands disposed within the ring of die pads;
    bond terminals disposed on the lands, the bond terminals being wire-bonded to respective ones of the die pads; and
    at least one capacitor having respective terminals mounted to respective ones of the lands.

2. The semiconductor device of claim 1, further comprising:
    a carrier substrate configured to support the IC die.

3. The semiconductor device of claim 1, wherein the lands are part of a redistributive metal layer formed on the IC die.

4. The semiconductor device of claim 3, further comprising:
- a molded package encapsulating the IC die and the at least one capacitor.

5. The semiconductor device of claim 1, further comprising:
- a molded package encapsulating the IC die and the at least one capacitor.

6. The semiconductor device of claim 1, wherein each of the at least one capacitor comprises a surface-mount chip capacitor.

7. The semiconductor device of claim 1, wherein the respective terminals of the at least one capacitor are soldered to the respective ones of the lands.

8. The semiconductor device of claim 1, wherein the at least one capacitor is attached to the IC die such that the respective terminals thereof contact the respective ones of the lands.

9. The semiconductor device of claim 1, further comprising:
- a capacitor carrier attached to the IC die, the capacitor carrier including the lands and the at least one capacitor; and
- bond terminals coupled to the lands, the bond terminals being wire-bonded to respective ones of the die pads.

10. The semiconductor device of claim 9, wherein the capacitor carrier comprises an organic or ceramic material.

11. The semiconductor device of claim 9, further comprising:
- a molded package encapsulating the IC die, the capacitor carrier, and the at least one capacitor.

* * * * *